(12) United States Patent
Weiss et al.

(10) Patent No.: US 7,196,522 B2
(45) Date of Patent: Mar. 27, 2007

(54) POWER CIRCUIT OF A COIL AND PROBE AND NMR SPECTROMETER COMPRISING SUCH A CIRCUIT

(75) Inventors: Michel Weiss, Gries (FR); Laurent Martinache, Marienthal (FR); Olivier Gonella, Bischwiller (FR)

(73) Assignee: Bruker Biospin SA (Societe Anonyme), Wissembourg (FR)

( * ) Notice: Subject to any disclaimer, the term of this patent is extended or adjusted under 35 U.S.C. 154(b) by 0 days.

(21) Appl. No.: 11/155,665

(22) Filed: Jun. 20, 2005

(65) Prior Publication Data

US 2005/0280418 A1 Dec. 22, 2005

(30) Foreign Application Priority Data

Jun. 18, 2004 (FR) .................... 04 06663

(51) Int. Cl.
*G01V 3/00* (2006.01)
(52) U.S. Cl. ..................................... 324/322
(58) Field of Classification Search ................ 324/322
See application file for complete search history.

(56) References Cited

U.S. PATENT DOCUMENTS

| | | | | |
|---|---|---|---|---|
| 4,446,431 A | * | 5/1984 | McKay | 324/322 |
| 4,594,566 A | * | 6/1986 | Maudsley | 333/219 |
| 4,812,764 A | * | 3/1989 | Bendall | 324/318 |
| 4,833,412 A | * | 5/1989 | Zens | 324/322 |
| 5,107,217 A | * | 4/1992 | Duerr | 324/322 |
| 5,229,724 A | * | 7/1993 | Zeiger | 324/322 |
| 5,243,289 A | * | 9/1993 | Blum et al. | 324/322 |
| 5,861,748 A | * | 1/1999 | Schaefer et al. | 324/318 |
| 5,949,311 A | * | 9/1999 | Weiss et al. | 333/202 |
| 6,307,371 B1 | * | 10/2001 | Zeiger | 324/318 |
| 6,933,725 B2 | * | 8/2005 | Lim et al. | 324/322 |

(Continued)

FOREIGN PATENT DOCUMENTS

EP 0073614 3/1983

(Continued)

OTHER PUBLICATIONS

Cross V R et al: "Single coil probe with transmission-line tuning for nuclear magnetic double resonance" Review of Scientific Instruments, vol. 47, 1976, pp. 1468-1488, XP008043907 ISSN: 0034-6748 Entire Document.

*Primary Examiner*—Diego Gutierrez
*Assistant Examiner*—Dixomara Vargas
(74) *Attorney, Agent, or Firm*—Young & Thompson

(57) ABSTRACT

A power circuit of a coil, includes two power or transmission line segments that are each connected to one of two ends of this coil, the line segments forming with the coil an oscillating circuit exhibiting a determined resonance frequency. The circuit has two line segments each including at least two conductors, of which one is connected to coil, and between them exhibit identical structures and identical lengths of connected conductors, whereby this common length is essentially a multiple of half of the resonance wavelength of the oscillating circuit. The conductors which are connected to coil at one of their ends are connected to one another at their other end by an adjustable symmetrical tuning component that completes this oscillating circuit, which with symmetrical structure is powered by a primary power circuit.

30 Claims, 16 Drawing Sheets

U.S. PATENT DOCUMENTS

| | | | |
|---|---|---|---|
| 6,980,000 B2 * | 12/2005 | Wong et al. | 324/318 |
| 7,106,061 B2 * | 9/2006 | Zeiger et al. | 324/318 |
| 2002/0171426 A1 * | 11/2002 | Hasegawa | 324/322 |
| 2005/0280417 A1 * | 12/2005 | Weiss et al. | 324/322 |

FOREIGN PATENT DOCUMENTS

| | | |
|---|---|---|
| EP | 0890848 | 1/1999 |
| EP | 1249709 | 10/2002 |

* cited by examiner

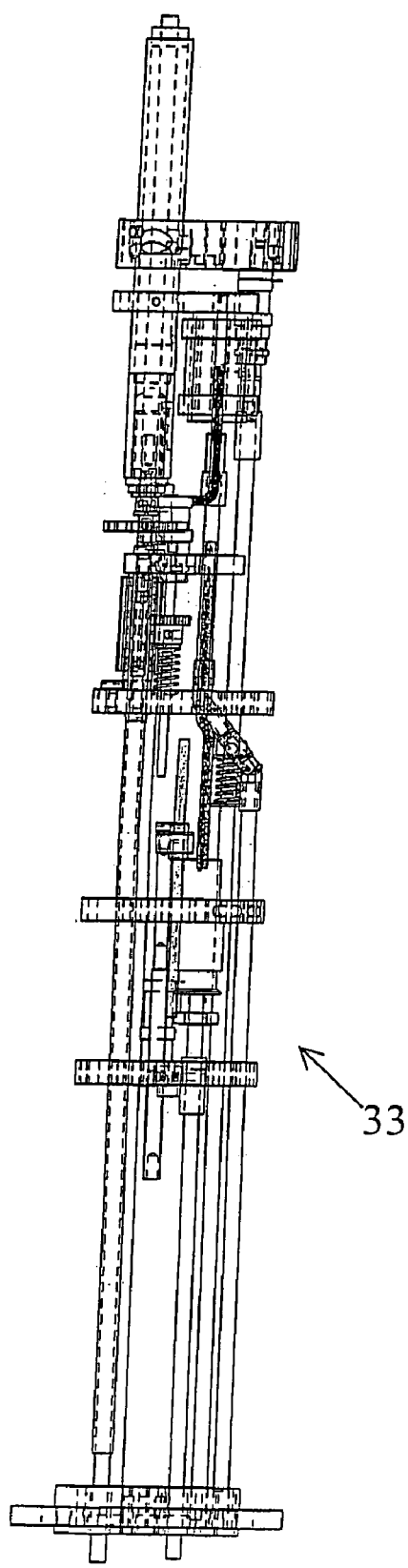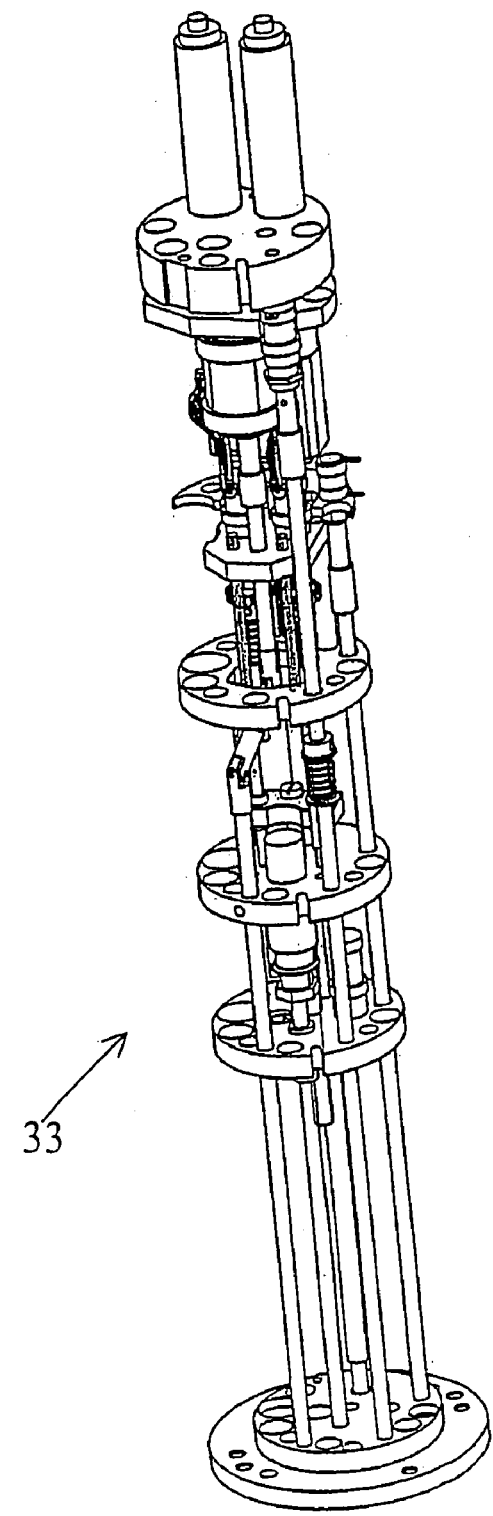
Fig. 10B
Fig. 10C

POWER CIRCUIT OF A COIL AND PROBE AND NMR SPECTROMETER COMPRISING SUCH A CIRCUIT

BACKGROUND OF THE INVENTION

This invention relates to the field of precision power supplies, in particular in the nuclear magnetic resonance field, and it has as its object a power circuit of a coil, in particular a sample coil, as well as an NMR probe and an NMR spectrometer that comprises such a circuit.

In some applications, it is necessary to use a very specific power, in terms of characteristics and properties of the currents delivered, for circuits that are used in particular or extreme circumstances or contexts.

Such is particularly the case for the power of sample or NMR coils, located in the core of the NMR spectrometers.

In particular in the NMR experiments of the solid, it is necessary to use maximum current specifically in the region that receives the sample (subjected to a rotation at several tens of thousands of rotations per second), i.e., in the center of the coil.

Various power systems have already been proposed to address the above-mentioned need.

These known systems, however, do not provide full satisfaction and exhibit limitations.

The multifrequency analysis is actually generalized, and this is why it is necessary to have several ways to power the coil, at different determined frequencies (each corresponding to a type of core to be detected), each meeting the above-mentioned maximum current condition.

The multifrequency power systems currently proposed (see, for example, U.S. Pat. No. 5,861,748) have a very complicated structure (often very difficult to house readily in the narrow cylindrical space that is set aside for that purpose when the probe that contains the coil is received), whereby each power path has to comprise insulation means relative to the influences of the other paths.

Moreover, these known systems are very non-flexible, and even rigid, in terms of frequency variation of different paths or a change in the number of paths (addition of a path or elimination of a path). Any modification in regard to a path affects all other paths existing within the system and requires an adjustment or changes with regard to the latter, which themselves again have additional repercussions, and in particular because of their dissymmetrical structure.

SUMMARY OF THE INVENTION

This invention has as its object to propose a simple solution that allows at least some of the above-mentioned drawbacks to be overcome.

For this purpose, the invention has as its object a power circuit of a coil, in particular an NMR coil or a sample coil, comprising two power or transmission line segments that are each connected to one of the two ends of this coil, whereby said line segments form with said coil an oscillating circuit or a first oscillating circuit that exhibits a determined resonance frequency, characterized in that the two line segments each comprise at least two conductors, one of which is connected to the coil, and between them exhibit identical structures and identical lengths of connected conductors, whereby this common length is essentially a multiple of half of the resonance wavelength of said oscillating circuit, in that the conductors that are connected to the coil at one of their ends are connected to one another at their other end by an adjustable symmetrical tuning circuit or component, thereby completing this oscillating circuit, and in that said oscillating circuit with symmetrical structure is powered by a primary power circuit by means of a transfer of energy by magnetic coupling, capacitive coupling or magneto-capacitive coupling of said primary power circuit with at least one of the two conductors that are connected to the coil and to the tuning circuit or component.

BRIEF DESCRIPTION OF THE DRAWINGS

The invention will be better understood thanks to the description below, which relates to preferred embodiments that are given by way of nonlimiting examples and that are explained with reference to attached schematic drawings, in which:

FIGS. 10A, 10B and 10C are views respectively in lateral elevation (FIGS. 10A and 10B) and in perspective (FIG. 10C), on different scales, of a multifrequency NMR probe, provided with a power circuit according to the invention.

FIGS. 1A, 1B, 2, 3A, 3B, 4, 5A, 5B and 5C each show a power circuit 1 of a coil 2, in particular of an NMR coil or a sample coil, comprising two power or transmission line segments 3 and 3' each connected at one of two ends of this coil 2, whereby said line segments 3, 3' form with said coil 2 an oscillating circuit or a first oscillating circuit 4 that exhibits a determined resonance frequency.

DETAILED DESCRIPTION OF THE PREFERRED EMBODIMENTS

Figure 1A:
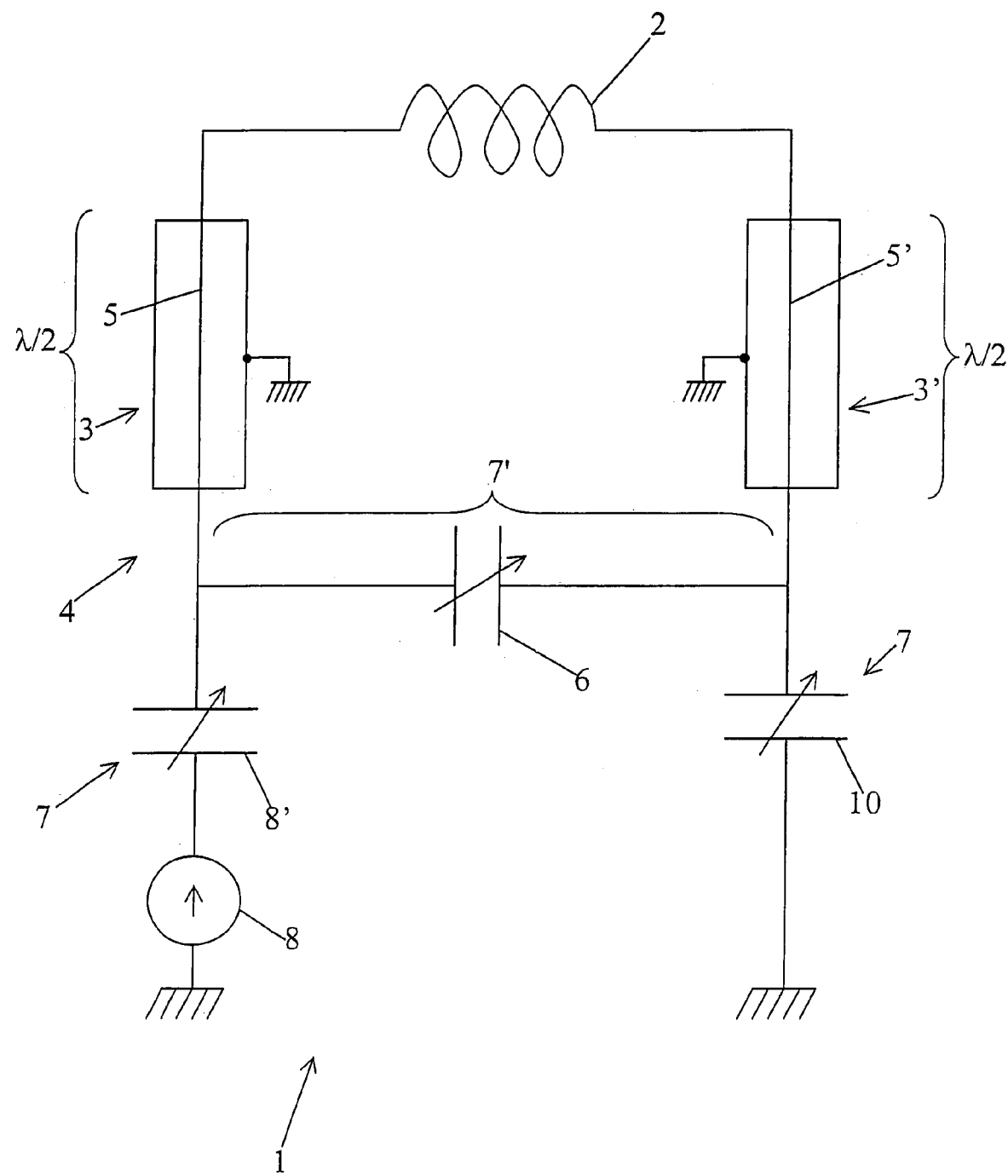
FIGS. 1A and 1B are schematic representations, partially symbolic, of two variants of a first embodiment of a power circuit according to the invention, producing power at a single frequency.

According to the invention, this power circuit 1 is characterized in that two line segments 3 and 3' each comprise at least two conductors 5, 5'; 5", 5''', of which one 5, 5' is connected to coil 2 and between them have identical structures and identical connected conductor lengths, whereby this common length is essentially a multiple of half of the resonance wavelength of said oscillating circuit 4, in that conductors 5, 5' that are connected to coil 2 at one of their ends are connected to one another at their other end by an adjustable symmetrical tuning circuit or component 6 that completes this oscillating circuit 4, and in that said oscillating circuit 4 with a symmetrical structure is powered by a primary power circuit 7 by means of a transfer of energy by magnetic coupling, capacitive coupling or magneto-capacitive coupling of said primary power circuit 7 with at least one of two conductors 5, 5' connected to coil 2 and to tuning circuit or component 6.

Attached to a first variant of a first embodiment, shown in FIG. 1A of the attached drawings, primary power circuit 7 can be partially merged with first oscillating circuit 4 by integrating a common portion of secondary circuit 7' with this first oscillating circuit and can comprise, on the one hand, a radio-frequency generator 8 that is tuned to the determined resonance frequency of first oscillating circuit 4 and is connected to said first oscillating circuit 4 at a terminal of the adjustable symmetrical tuning circuit or component 6 by means of a coupling capacitor 8', and, on the other hand, an adaptation circuit or component 10 that is connected to the other terminal of adjustable symmetrical tuning circuit or component 6, whereby adaptation component 10 and adjustable symmetrical tuning component 6 are part of two circuits 4 and 7, consisting of capacitors and generator 8 that operate continuously, intermittently or in surges.

Figure 1B:
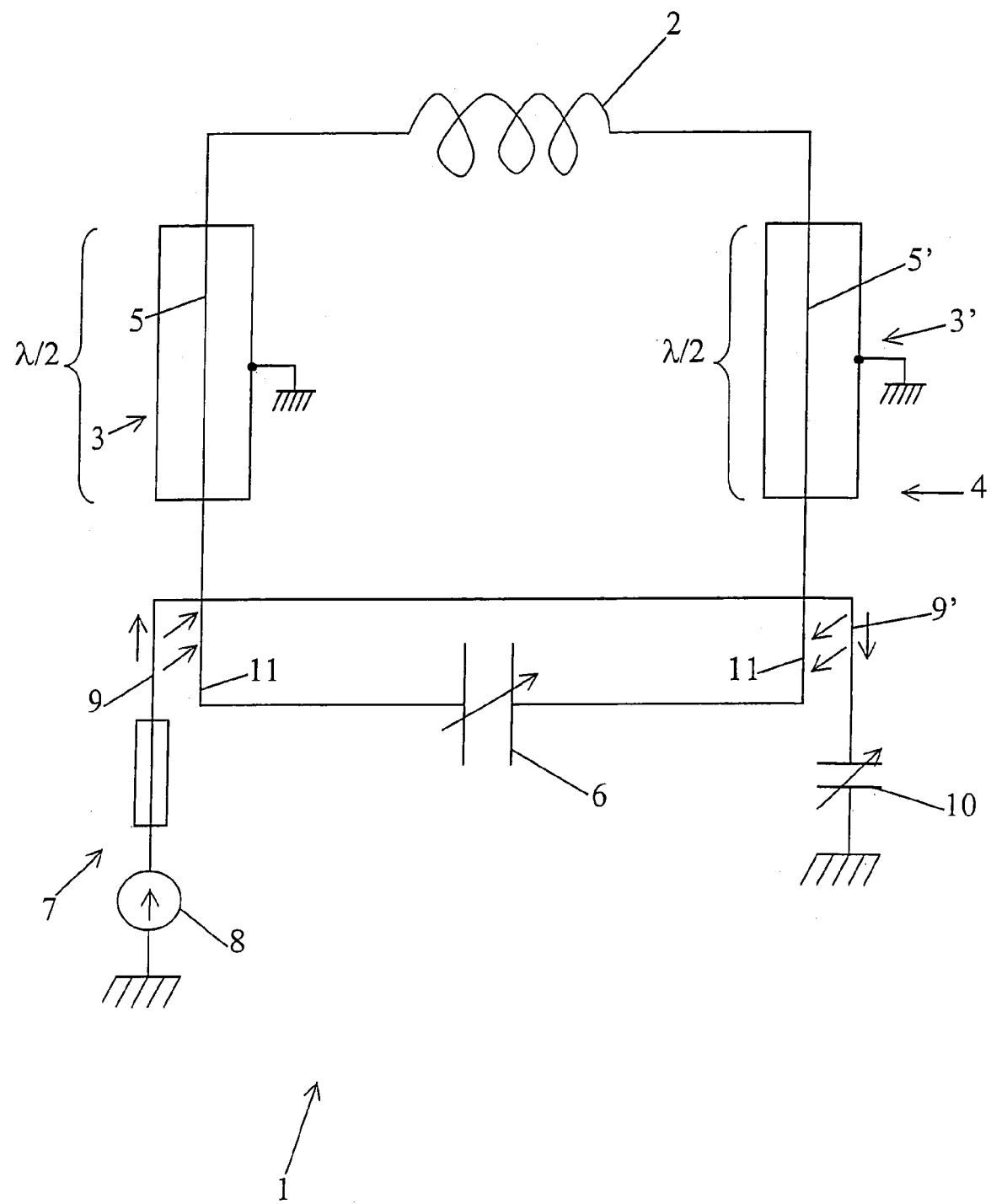

According to a second variant of a first embodiment, shown in FIG. 1B of the attached drawings, primary power circuit 7 consists of a separate circuit and comprises, in addition to a radio-frequency generator 8 that is tuned to the determined resonance frequency of part or parts 9, 9' that take part in coupling with at least one of two conductors 5, 5' of one or more line segments 3, 3' that are connected to coil 2 and to tuning circuit or component 6, also an adaptation circuit or component 10, intended to optimize the coupling and to limit some of its effects at primary power circuit 7, whereby generator 8 operates continuously, intermittently or in surges.

In relation to this second variant, the coupling preferably consists of a coupling that is essentially magnetic in nature and in that adaptation circuit or component 10 is preferably an adjustable capacitor that is intended to cancel the inductive reactance at primary power circuit 7.

Figure 2:
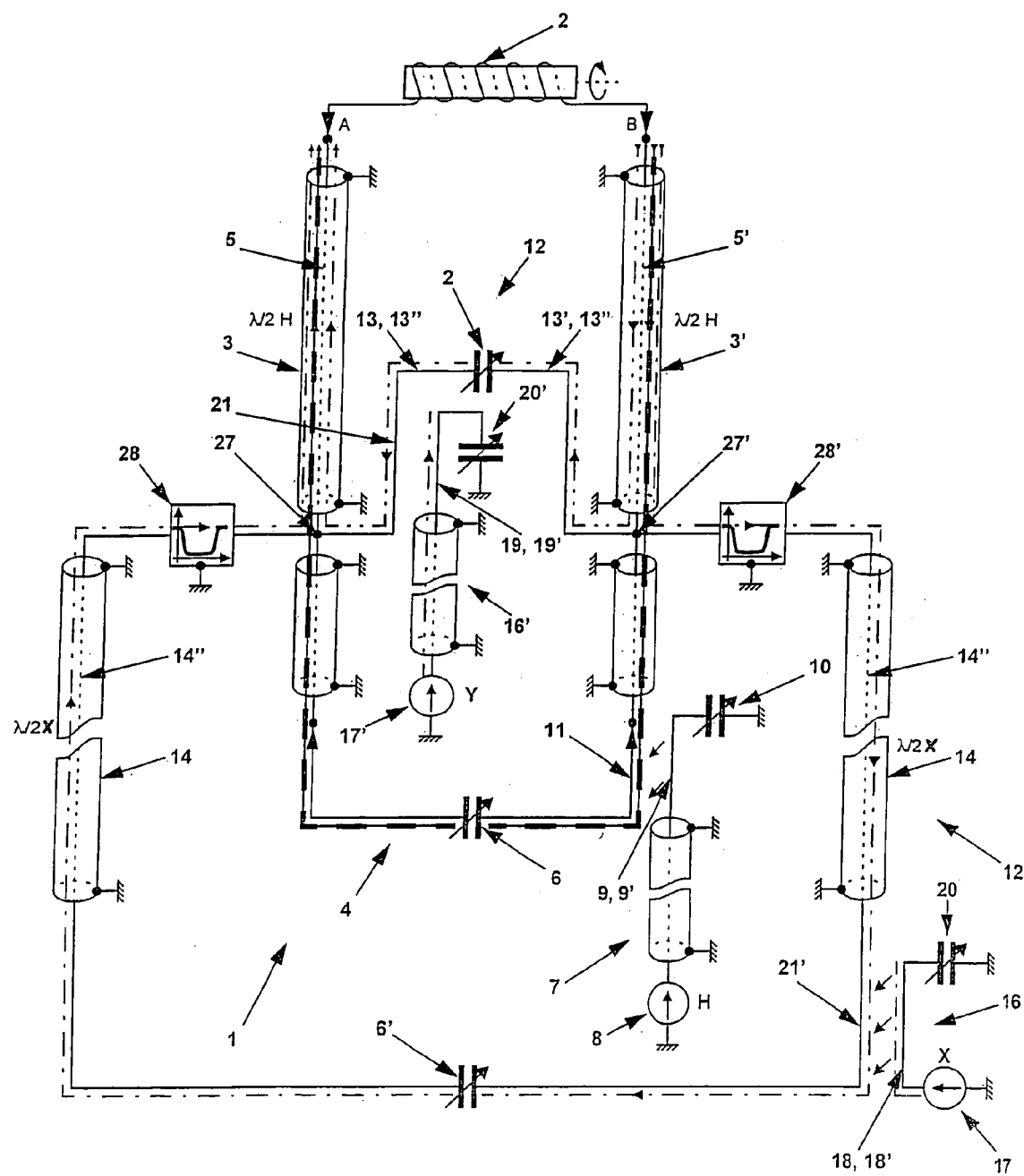
FIGS. 2, 3A and 3B are schematic representations, partially symbolic, of three variants of a second embodiment of a power circuit according to the invention, producing power at three different frequencies.

As FIG. 1A shows within the framework of a capacitive coupling, and as FIG. 2 shows within the framework of a coupling that is essentially magnetic in nature, it is possible to use a single symmetrical or asymmetrical coupling [by providing in this latter case measures for compensation and symmetrization in oscillating circuit 4 (or 12, 12') in question].

However, the transfer of energy by coupling between primary power circuit 7 and oscillating circuit 4 preferably consists of a double coupling and symmetrically and equivalently assigns conductors 5 and 5'; 5", 5''' that are connected to coil 2 of two transmission line segments 3 and 3' (see FIGS. 1B, 3A, 3B, 4, 5A, 5B and 5C).

According to a first practical embodiment of a preferably symmetrical coupling that is essentially magnetic in nature and as shown in FIGS. 1B, 2, 3A, 3B, 4, 5B and 5C, the coupling or each of the two couplings carrying out the transfer of energy consists of a primarily magnetic coupling between, on the one hand, a segment 11 of a conductor 5, 5' that is connected to coil 2 of one of line segments 3, 3' of oscillating circuit 4, and, on the other hand, a segment 9, 9' of the line that connects generator 8 to adaptation component 10 in primary power circuit 7, whereby these two segments 11 and 9, 9' of determined lengths are placed parallel and close to one another and form Lecher lines.

Figure 5A:
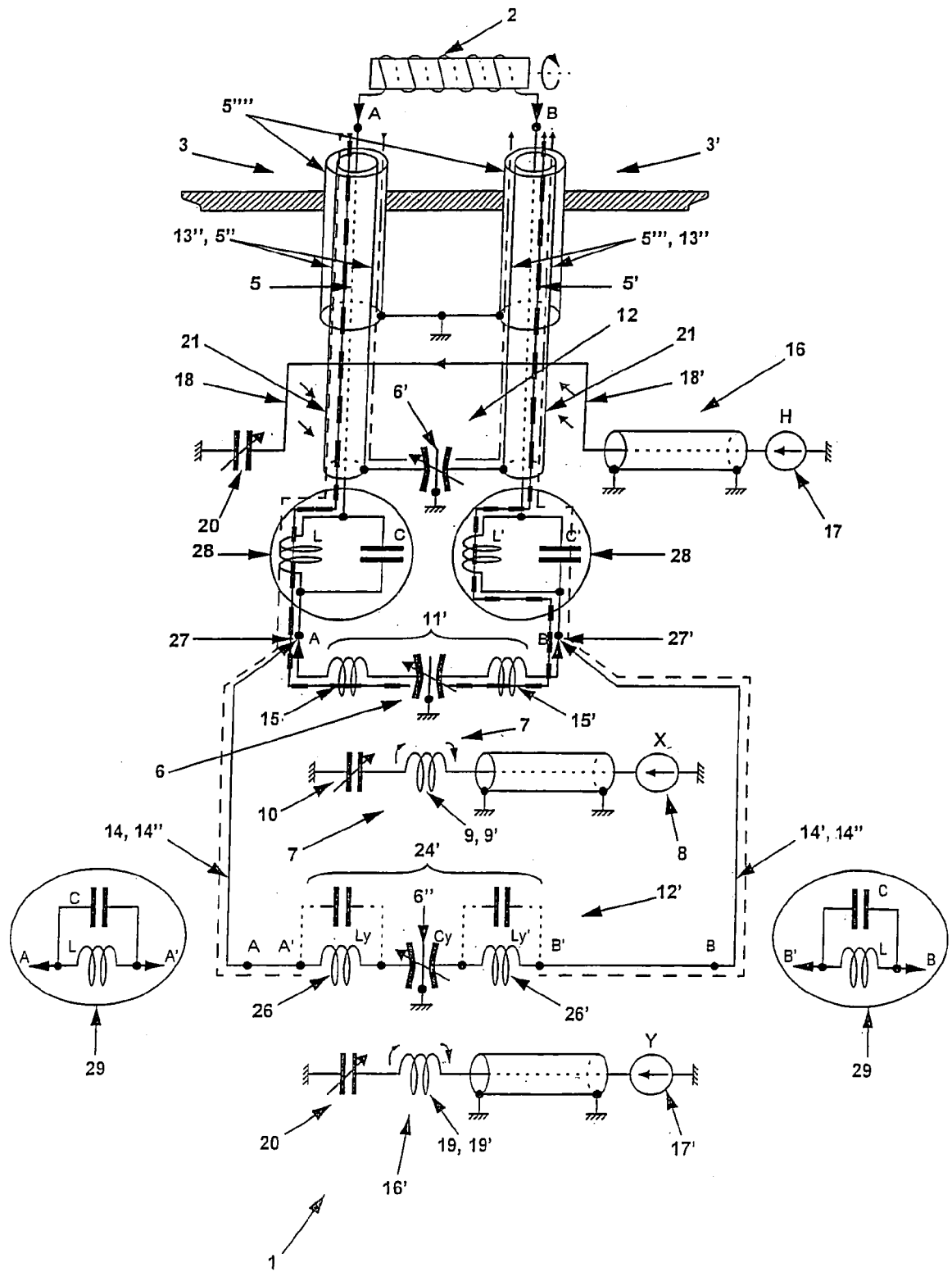
Figure 6:
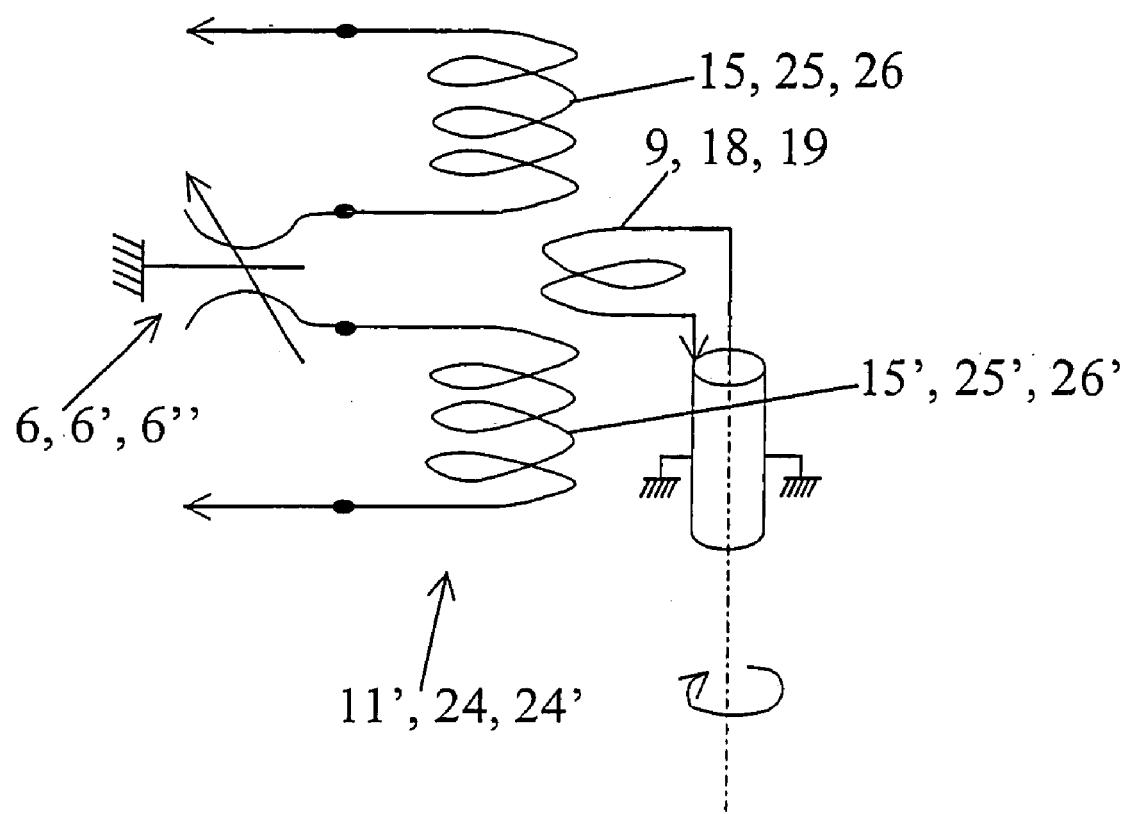
FIG. 6 is a schematic representation of an embodiment of a variable magnetic coupling between an oscillating circuit and a primary power circuit, forming part of a power circuit according to the invention.
Figure 7:
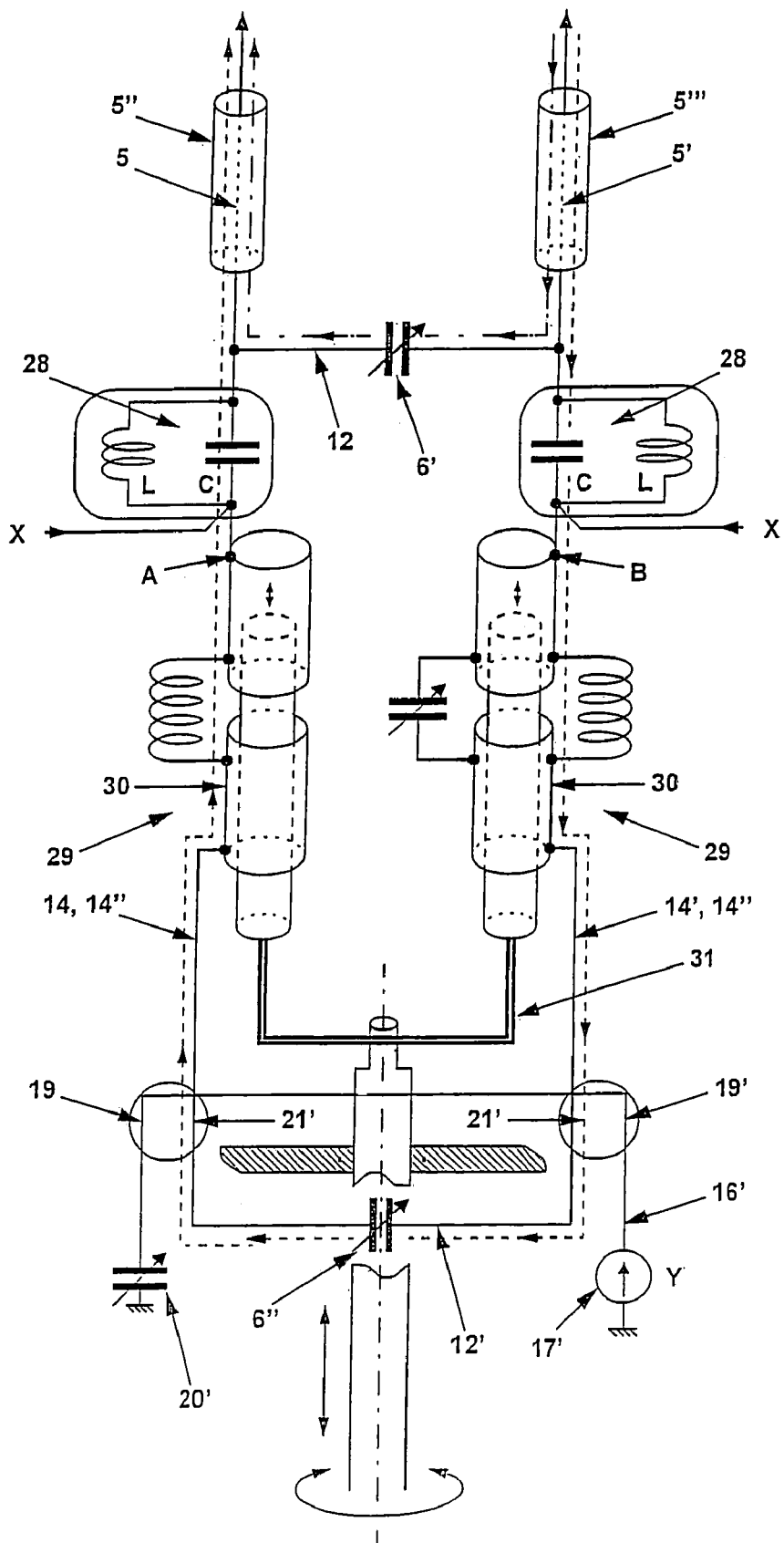
FIG. 7 is a schematic representation of an embodiment of the reject filter units that are part of the power circuit shown in FIG. 3B.
Figure 8A:
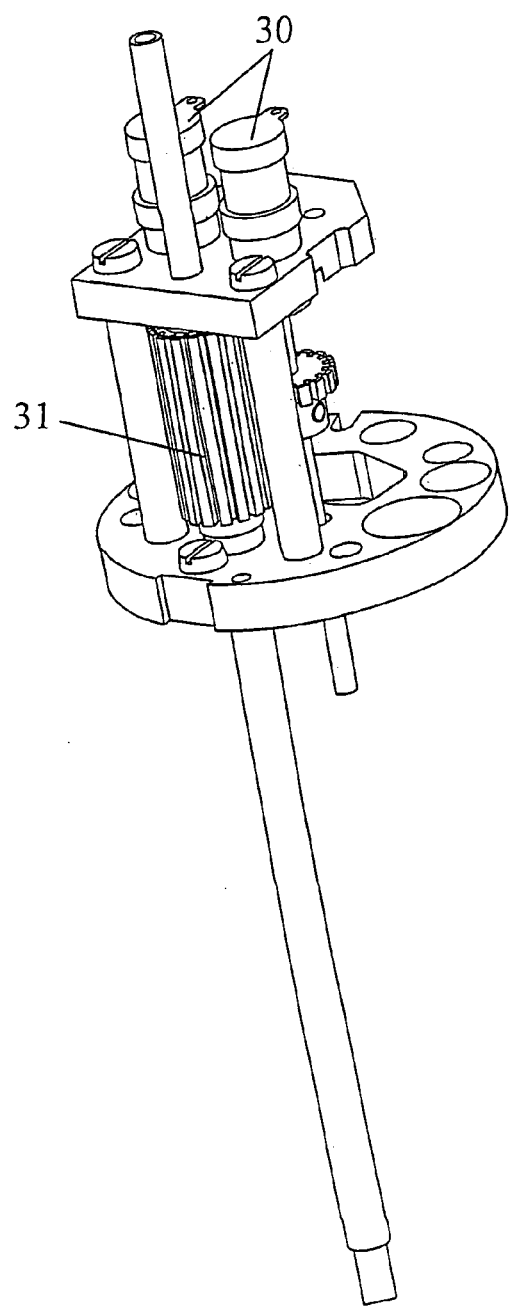
FIGS. 8A and 8B are perspective views of another embodiment of the variable capacitors of a pair of reject filters that are part of the power circuit shown in FIG. 3B.
Figure 8B:
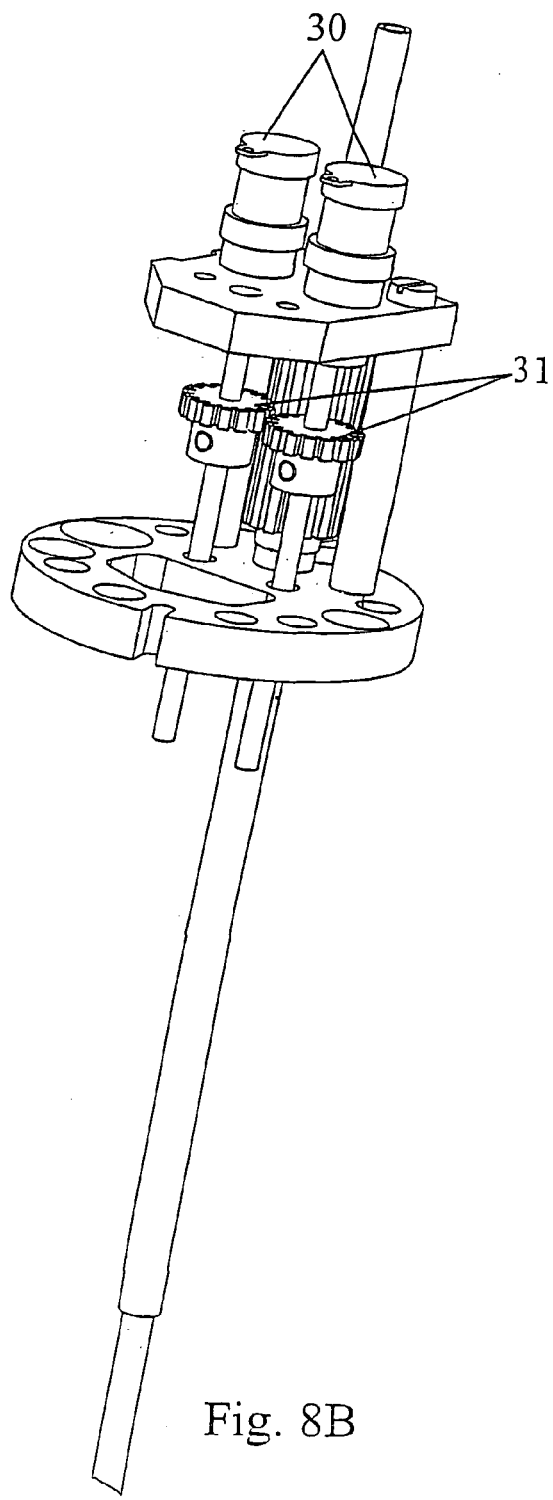
Figure 9:
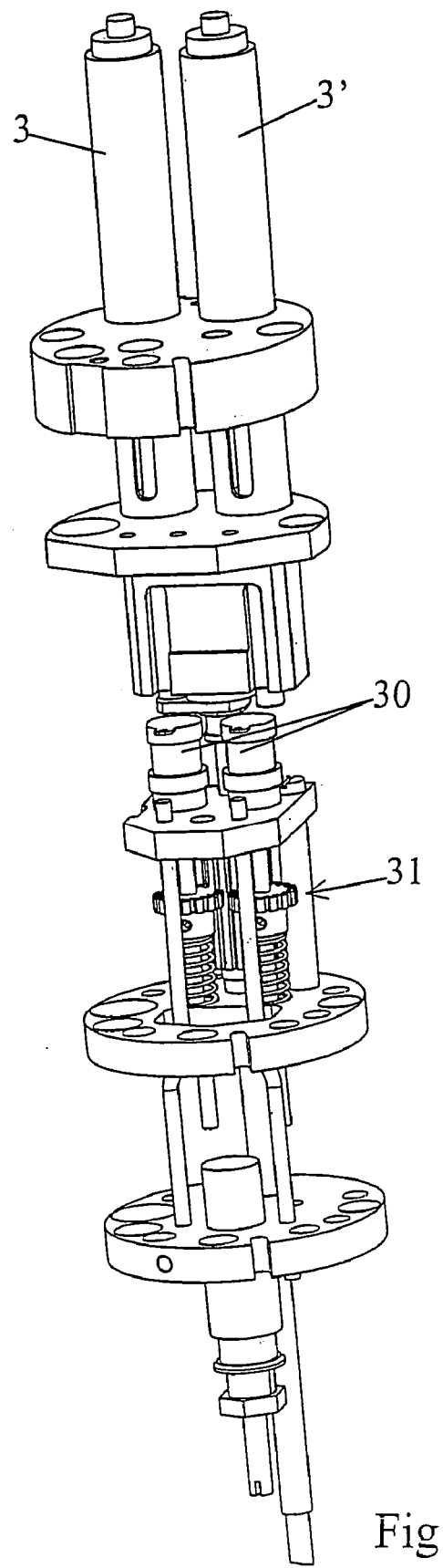
FIG. 9 is a perspective view of the pair of capacitors of FIGS. 8A and 8B, integrated into a portion of a multifrequency NMR probe according to the invention.
Figure 10A:
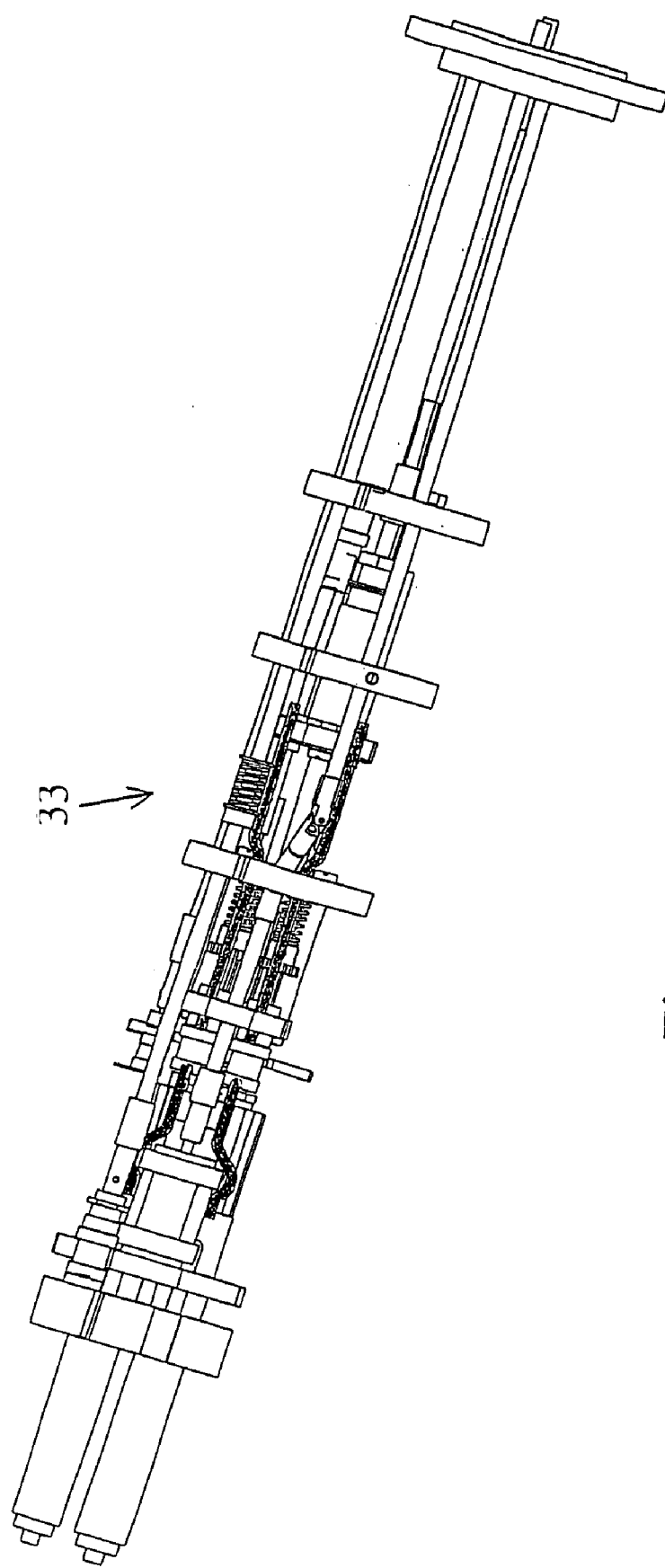

According to a second practical embodiment of a preferably symmetrical coupling that is essentially magnetic in nature and as shown in FIGS. 5A and 6, the coupling that carries out the transfer of energy consists of a symmetrical or asymmetrical magneto-capacitive coupling between, on the one hand, a solenoid 9 that is mounted in series in primary power circuit 7, and, on the other hand, a capacitor/inductance unit 11' that is mounted in series in oscillating circuit 4, whereby said capacitor can correspond to tuning component 6, and the inductances can comprise two equivalent inductances 15, 15' that are mounted in series on both sides of said capacitor 6, optionally by each being part of an LC circuit.

According to a very advantageous embodiment of the invention, allowing power supplies with at least two different frequencies, the power circuit comprises at least one additional oscillating circuit 12, 12' that exhibits a resonance frequency that is different from that of first oscillating circuit 4 and each is formed, if necessary, via coil 2, by mutually equivalent portions of a conductor 5, 5', 5", 5''' of two line segments 3, 3' of first oscillating circuit 4, and, optionally, two additional transmission line segments 13, 13'; 14, 14' that are each connected by one of the ends of at least one of their respective conductors 13", 14" to one of conductors 5, 5"; 5', 5''' of one of two above-mentioned line segments 3, 31 and that exhibit between them identical structures and lengths. The sum of the length of each of said two additional transmission line segments 13, 13'; 14, 14' and the length of the part of conductor 5, 5'; 5", 5''' that is respectively associated with one of the two line segments 3, 3' is a multiple of half of the resonance wavelength of additional oscillating circuit 12, 12' that is being considered, and additional transmission lines 13, 13'; 14, 14' are connected at their other end to a tuning circuit or component 6', 6". Said at least one or each additional oscillating circuit 12, 12' is powered by its own corresponding primary power circuit 16, 16' by means of a transfer of energy by magnetic coupling, capacitive coupling or magneto-capacitive coupling of this respective corresponding primary power circuit 16, 16' with at least one of conductors 13"; 14" that are connected to or are part of line segments 3, 3' of first oscillating circuit 4, of at least one of two additional transmission line segments 13, 13'; 14, 14' (FIGS. 2, 3A, 3B, 4, 5A, 5B and 5C).

In general, the spectrometric analyses require the provision of three different excitation frequencies for the detection of three types of cores. These three frequency channels generally comprise a high frequency that corresponds to the resonance of the H core (proton—named channel H) and two other channels that cover the resonant cores in a lower frequency band. This lower frequency band is divided into two sub-bands, whereby sub-band Y corresponds to a low sub-band, and sub-band X corresponds to the high sub-band (respectively named channel Y and channel X).

In the figures of the attached drawings, some additional indications (in addition to numerical references) make it possible to identify the circuit components or parts that belong to or take part in power paths of these three channels.

In the figures of the attached drawings, in particular in FIGS. 2, 3A, 3B, 4, 5A, 5B and 5C, the signals of different paths (H, X and Y) are shown with lines of different natures to distinguish them from one another, in particular at line segments 3 and 3' (broken lines of different types and continuous lines with segments of alternately different thicknesses).

According to a first above-mentioned advantageous variant embodiment, not shown in the attached figures (but able to be deduced from FIG. 1A), primary power circuit 16, 16' that is unique to each additional oscillating circuit 12, 12' is partially merged with the associated additional oscillating circuit by integrating a part of a common circuit with this additional oscillating circuit and comprises, on the one hand, a radio-frequency generator that is tuned to the determined resonance frequency of said additional oscillating circuit in question and is connected to the latter at a terminal of the adjustable symmetrical tuning circuit or component of this additional oscillating circuit via a coupling capacitor, and, on the other hand, an adaptation circuit or component connected to the other terminal of the above-mentioned adjustable symmetrical tuning circuit or component, whereby the above-mentioned adaptation component and the adjustable symmetrical tuning component are part of the two circuits, consisting of capacitors.

According to a second advantageous variant embodiment that is evident from FIGS. 2, 3A, 3B, 4, 5A, 5B and 5C, the separate primary power circuit 16; 16' that is unique to each additional oscillating circuit 12; 12' comprises, in addition to a radio-frequency generator 17; 17' that is tuned to the determined resonance frequency and part or parts 18, 18'; 19, 19' that take part in coupling with at least one of conductors 13"; 14" of additional line segments 13', 13"; 14', 14", an adaptation circuit or component 20; 20', intended to optimize the coupling and to limit some of its effects at said suitable primary power circuit 16; 16', whereby generator 17, 17' operates continuously, intermittently or in surges.

The coupling with transfer of energy between the oscillating circuit or each additional oscillating circuit 12; 12' and its separate or respectively associated primary power circuit 16; 16' preferably consists of an essentially magnetic coupling, and adaptation circuit or component 20; 20' is preferably an adjustable capacitor that is intended to cancel the inductive reactance at suitable primary power circuit 16; 16' that is being considered.

Advantageously, the transfer of energy by coupling between suitable primary power circuit 16; 16' that is associated with an additional oscillating circuit 12, 12' and the latter consists of a double coupling, optionally with two essentially identical coupling zones and assigning symmetrically and equivalently conductors 13"; 14" of additional transmission line segments 13, 13'; 14, 14' that are connected to transmission line segments 3, 3' of first oscillating circuit 4.

As shown in FIGS. 2, 3A, 3B, 4, 5B and 5C, the coupling or each of two couplings that carry out the transfer of energy between a primary power circuit 16; 16' that is unique to an additional oscillating circuit 12; 12' and the latter consists of a magnetic coupling between, on the one hand, a segment 21; 21' of a conductor 13"; 14" of an additional line segment 13, 13'; 14, 14', connected to one of line segments 3, 3' of first oscillating circuit 4, and, on the other hand, a segment 18, 18'; 19, 19' of the line that connects generator 17; 17' to adaptation component 20; 20' in suitable primary power circuit 16; 16' that is associated with additional oscillating circuit 12; 12' that is being considered, whereby these two segments 21; 21' and 18, 18'; 19, 19' of determined lengths are placed in parallel and close to one another and form Lecher lines.

As a variant, and as FIGS. 5A and 6 show, it may be provided that the coupling that produces the transfer of energy between primary power circuit 16; 16' that is unique to an additional oscillating circuit 12; 12' and the latter consists of a symmetrical or asymmetrical magneto-capacitive coupling between, on the one hand, a solenoid 18; 19, mounted in series in said suitable primary power circuit 16, 16', and on the other hand, a capacitor/inductance unit 24; 24' that is mounted in series in additional oscillating circuit 12; 12' that is being considered, whereby said capacitor may correspond to tuning component 6'; 6", and the inductances may comprise two inductances 25, 25'; 26, 26' that are mounted in series on both sides of said capacitor 6'; 6" optionally by each being part of an LC circuit.

As FIGS. 5A and 6 of the attached drawings show, magneto-capacitive couplings [9, 11'] with regard to first oscillating circuit 4 and/or magneto-capacitive couplings [18, 24] and/or [19, 24'] with regard to additional oscillating circuit(s) 12, 12' can consist of, for example, a coil or a solenoid [9, 18, 19] whose position relative to respective sets [11', 24, 24'] of series arrangements of capacitor [6, 6', 6"] and inductances [15 and 15', 25 and 25', 26 and 26'] can be varied to vary the degree of coupling. This positional modification can result from, for example, a movement in rotation of solenoids [9, 18, 19], a movement in translation or the like.

To prevent any dissymetrization of first oscillating circuit 4 and/or any additional oscillating circuit 12, 12' by the addition or the grafting of a new additional oscillating circuit 12, 12', two additional line segments 13 and 13'; 14 and 14' that are part of said at least one or each additional oscillating circuit 12; 12' are connected, according to an advantageous characteristic, respectively to line segments 3 and 3' that are part of first oscillating circuit 4 at non-interfering cold points 27, 27' of conductors 5, 5 of these last line segments 3 and 3'.

Figure 4:
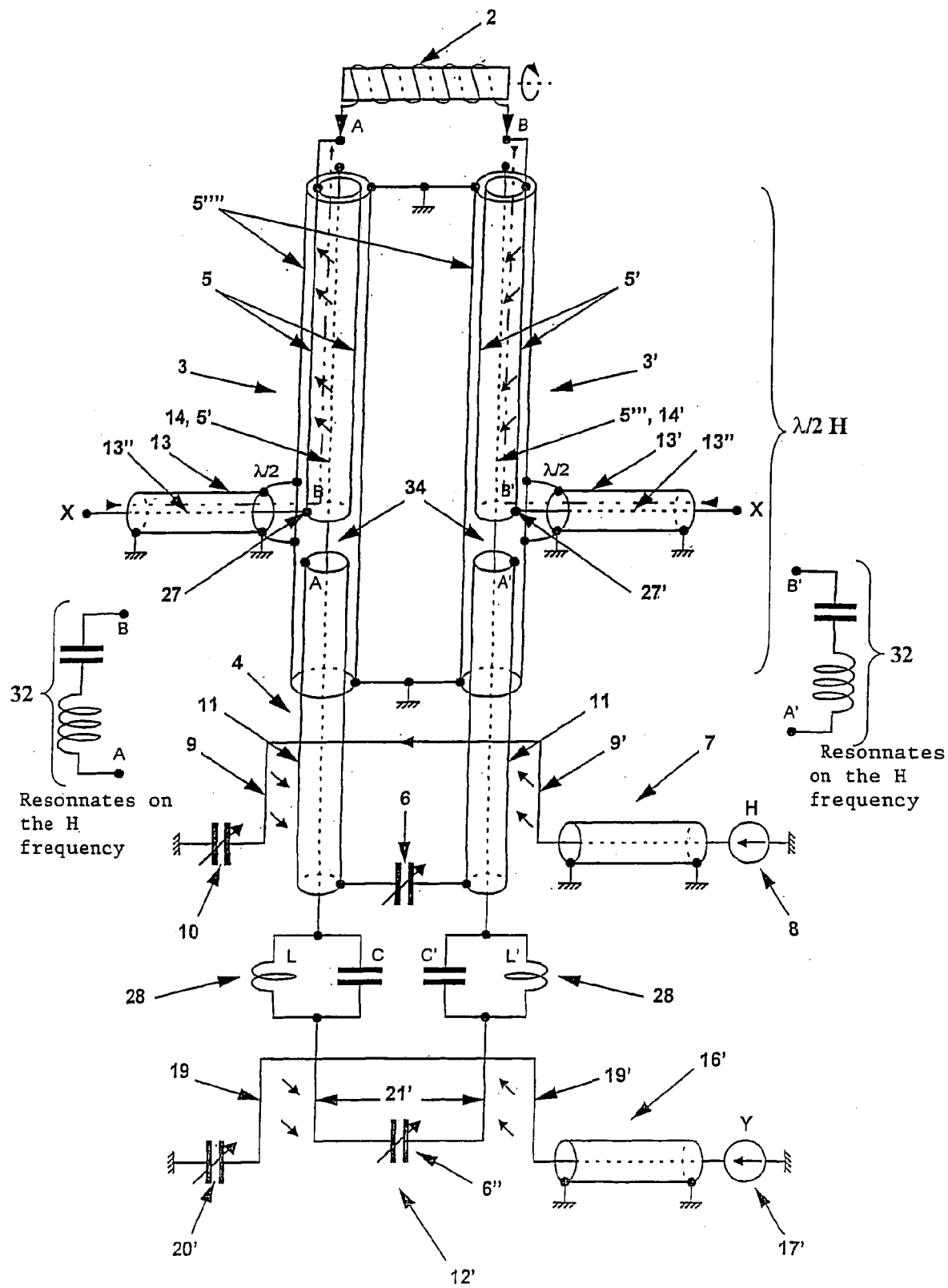
FIGS. 4, 5A and 5B are schematic representations, partially symbolic, of three variants of a third embodiment of a power circuit according to the invention, producing power at three different frequencies.

In certain configurations of circuits 1, two additional line segments 13 and 13'; 14 and 14' that are part of said at least one additional oscillating circuit 12; 12' are connected respectively to line segments 3 and 3' that are part of first oscillating circuit 4 with regard to the terminals of tuning circuit or component 6 of said first oscillating circuit 4 (FIGS. 4 and 5A).

By "symmetrical structure and constitution," applied to oscillating circuits that are part of power circuit 1, it should be understood at present that each oscillating circuit exhibits electrically, and therefore also physically, a symmetrical structure relative to the center of coil 2. Each oscillating circuit is looped, on the one hand, to this coil 2, and, on the other hand, to an adjustable symmetrical tuning circuit or component that is unique to this circuit, by two identical branches.

To limit as much as possible the influences between different power paths 4, 12, 12', it can be provided that first oscillating circuit 4 and/or the additional oscillating circuit or at least one of additional oscillating circuits 12; 12' integrate(s) one or more band reject insulation filters 28, 29, if necessary each of them, tuned to the resonance frequency of one or the other of other oscillating circuit(s) 4, 12 or 12'.

These insulation filters can, for example, come in the form of (a) pair(s) of filters 28 or 29, each filter of a given pair of filters 28, 29 being connected in series to or mounted in series with one of conductors 5, 5' connected to coil 2 of first oscillating circuit 4 or to one of conductors 13"; 14" of additional line segments 13, 13'; 14, 14' of additional oscillating circuit 12 or 12' being considered, connected to a transmission line 3, 3' of first oscillating circuit 4.

In addition, in the presence of a first oscillating circuit 4 and two additional oscillating circuits 12 and 12', at least one of said oscillating circuits 4, 12, 12' integrates two pairs of insulation filters 28 and 29, whereby each pair of filters 28, 29 is tuned to the resonance frequency of one 4, 12 or 12' of other two oscillating circuits 4, 12, 12'; whereby at least one of filter pairs (29) can be adjusted in frequency, preferably continuously.

Advantageously, and this is evident from FIGS. 7, 8A, 8B and 9 of the attached drawings, insulation filters 28, 29 consist of circuit pairs LC, filter pair(s) 29 optionally adjustable in frequency integrating variable capacitors 30 continuously with mutual mechanical control 31 for tuning them.

Variable capacitors 30 can consist of, for example, a moving part that is integral with one of the terminals of the capacitor and a stationary element that is integral with the other terminal, whereby the moving parts of two capacitors 30 are physically and/or kinematically connected to one another so as to be simultaneously displaced from the same amplitude of movement. The relative displacement of moving parts relative to the stationary parts varies the value of the capacitance of variable capacitors 30.

Said movement can consist of a translational motion (FIG. 7), whereby the moving part thus forms a mobile plunger that extends into the hollow cylinder that is formed by the stationary part and the two plungers are connected mechanically by a rigid connecting bar that is integral with a moving part (millimeter screw, for example). The movement can also consist of a rotation (FIGS. 8A, 8B and 9), the two moving parts then being mounted on rotating shafts equipped with gear wheels that are driven jointly by a drive gear that is integral with a control rod.

Figure 3A:
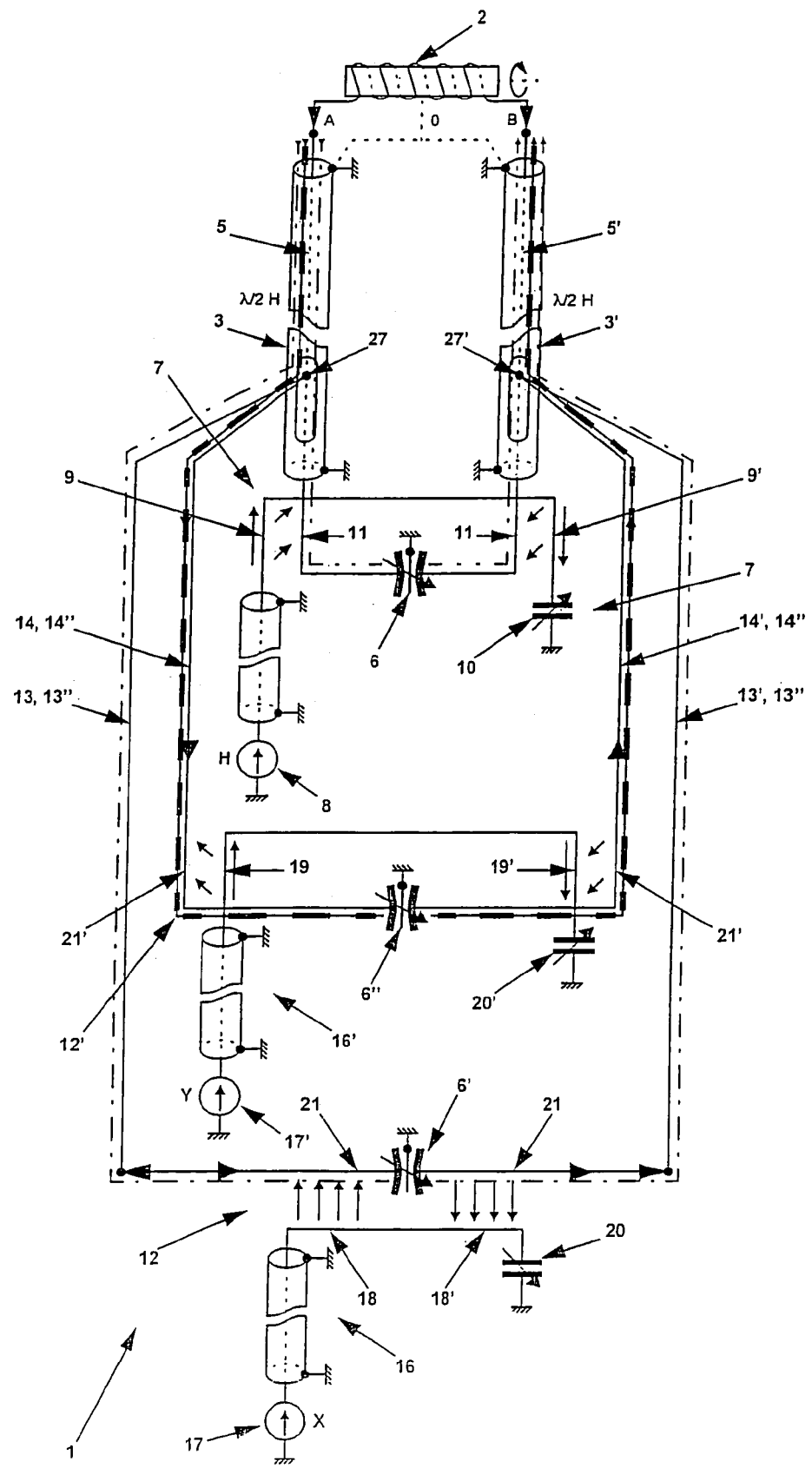
Figure 3B:
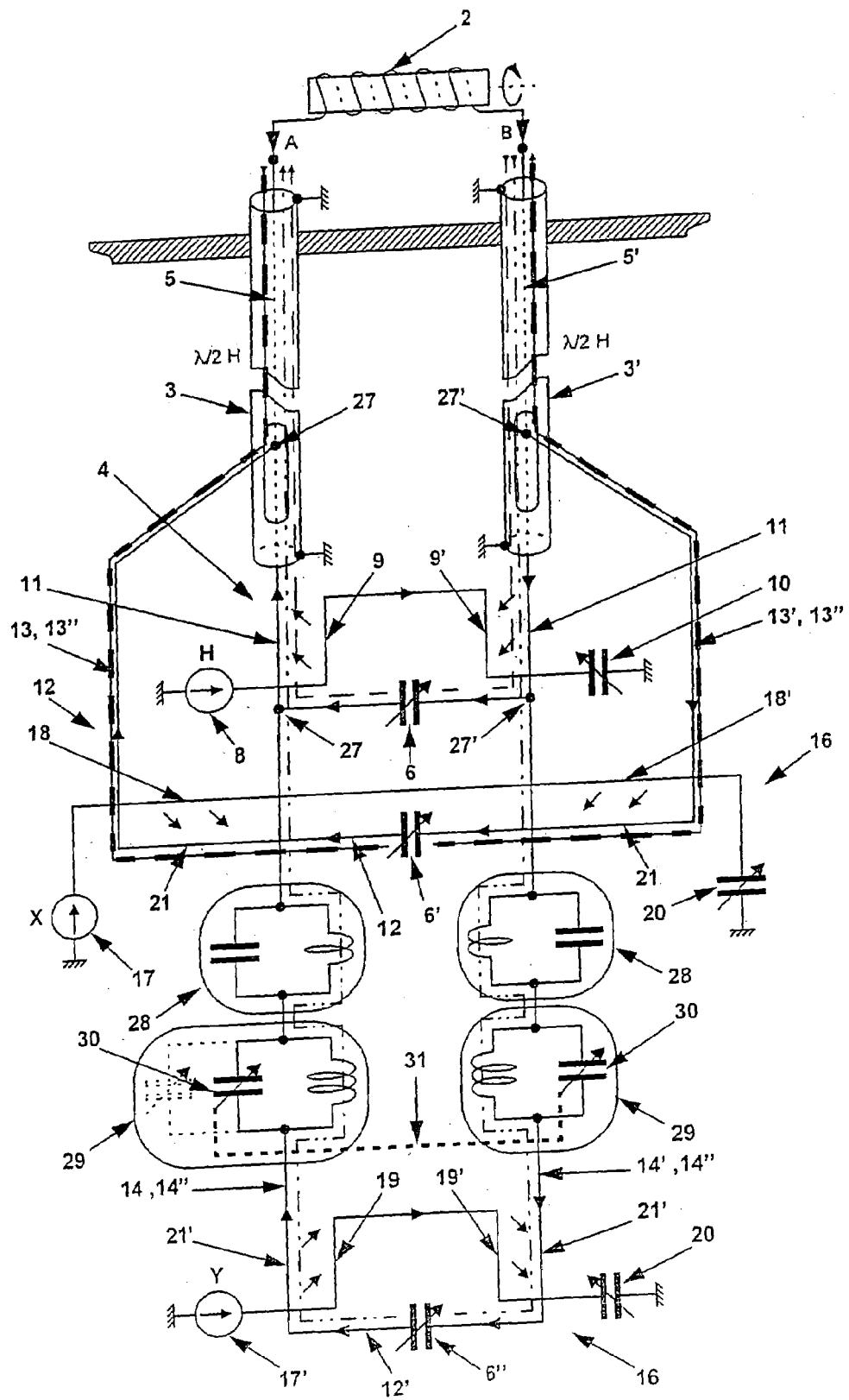

As is evident from FIGS. 2, 3A and 3B and according to a practical embodiment of the invention, transmission lines 3 and 3' that are part of first oscillating circuit 4 consist of coaxial lines, as well as preferably additional transmission lines 13, 13'; 14, 14'.

As is evident from FIGS. 4, 5A, 5B and 5C and according to another practical embodiment of the invention, transmission line segments 3 and 3' that are part of the first oscillating circuit consist of triaxial line segments or thee concentric conductors 5, 5", 5'''; 5', 5''', 5'''', whereby at least first oscillating circuit 4 integrates conductors 5 and 5' that are connected directly to coil 2 of said triaxial lines 3 and 3' and at least one other of said oscillating circuits 12, 12' integrates additional concentric conductors 5" and 5''' of said triaxial lines 3 and 3', and whereby a transfer of energy is carried out between these respectively associated concentric conductors 5", 5''' and 5, 5' because of the distributed line capacitance of said triaxial lines 3 and 3'.

According to a first configuration variant of this other above-mentioned practical embodiment, conductors 5 and 5' that are connected directly to coil 2 of triaxial lines 3 and 3' consist of intermediate conductors of the latter; at least one of additional oscillating circuits 12, 12' is connected to and integrates central conductors 5" and 5''' that are not connected to coil 2, whereby the line capacitance that is distributed between these central and intermediate conductors provides a connection by transfer of energy that allows said additional oscillating circuit 12, 12' that is being considered to loop to coil 2 via intermediate conductors 5 and 5' (FIG. 4).

In this first variant, it can be provided that intermediate conductors 5 and 5' each exhibit a cutoff or physical discontinuity 34 at a respective non-interfering cold point 27, 27' and that additional line segments 13, 13'; 14, 14' of at least one of additional oscillating circuits 12, 12' are connected at said cold points to portions of intermediate conductors 5, 5' that are connected to coil 2, whereby the portions of said conductors 5 and 5' facing said cutoff or discontinuity 34 are connected to one another via frequency-selective energy transfer circuits 32, for example pass-band filters centered on the resonance frequency of first oscillating circuit 4 and transmitting maximum energy for this frequency.

Figure 5B:
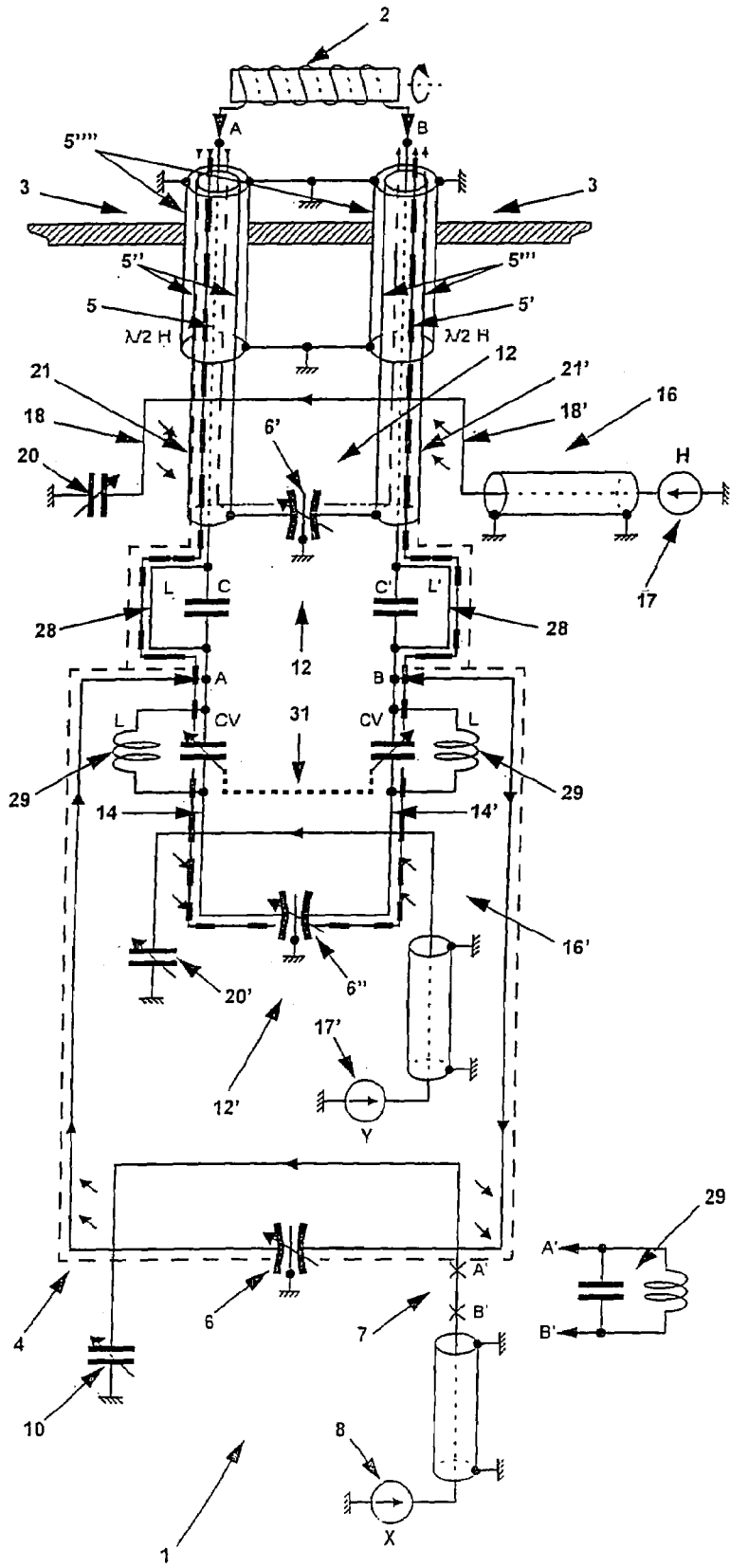
Figure 5C:
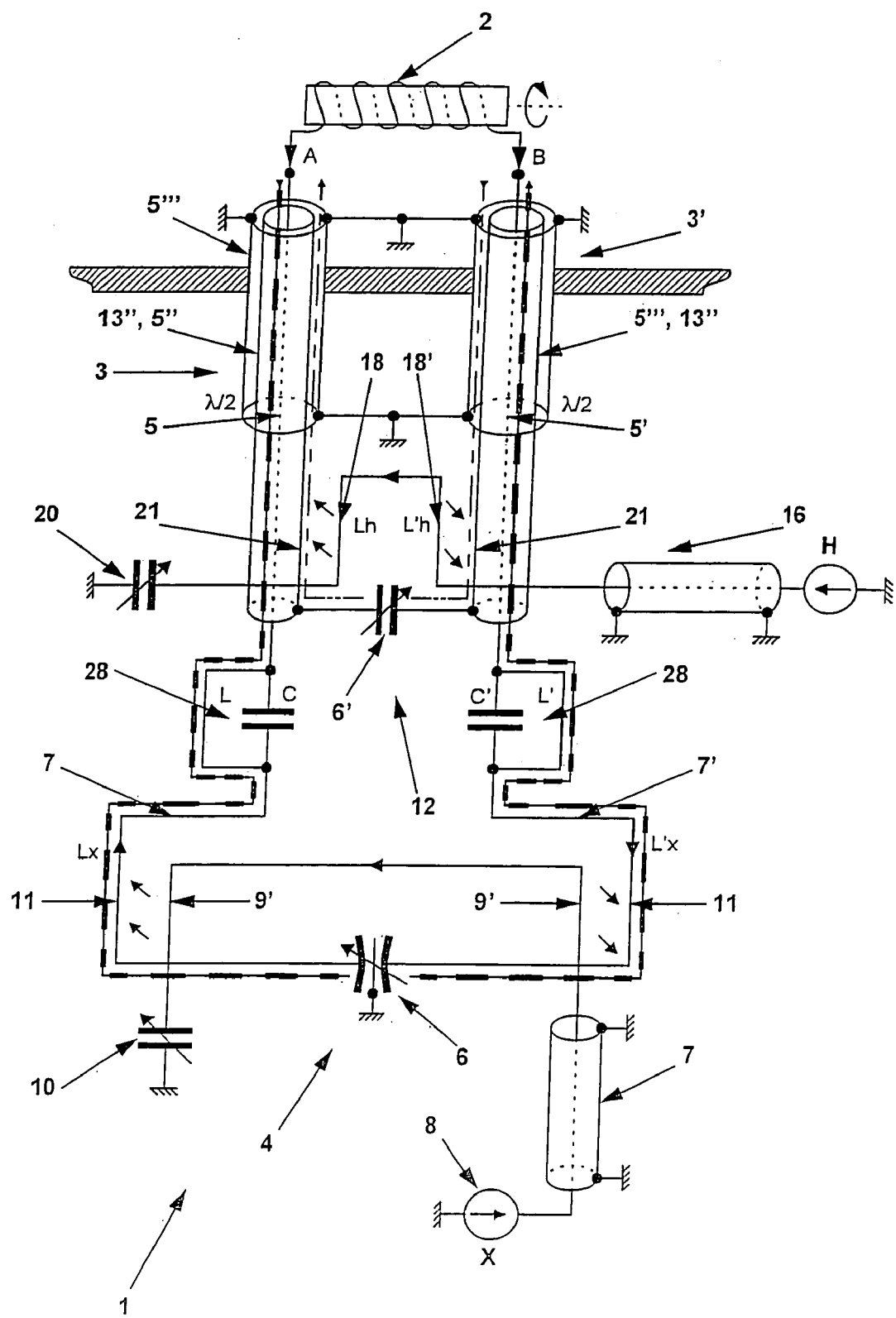
FIG. 5C is a schematic representation, partially symbolic, of an additional variant of the third embodiment, producing power at two different frequencies.

According to a second configuration variant of this other above-mentioned practical embodiment, conductors 5 and 5' that are directly connected to coil 2 of triaxial lines 3 and 3' consist of the central conductors of the latter and at least one of additional oscillating circuits 12 integrates intermediate conductors 5" and 5''' that are not connected to coil 2, whereby the line capacitance that is distributed between these central and intermediate conductors provides a connection by transfer of energy that allows said additional oscillating circuit 12, 12' that is being considered to loop to coil 2 via central conductors 5 and 5' (FIGS. 5A, 5B and 5C).

In this second variant, it can be provided that conductors 13"; 14" of additional line segments 13, 13'; 14, 14' of at least one other additional oscillating circuit 12' are connected to central conductors 5 and 5' at non-interfering cold points 27, 27' of these conductors, and that between them, reject filters 29 insulate first oscillating circuit 4 and additional oscillating circuit or circuits 12' whose conductors 13", 14" are connected to said central conductors 5 and 5', and that the latter oscillating circuits 4 and 12' are also, together, insulated from said at least one additional oscillating circuit 12 that integrates intermediate conductors 5" and 5''' that are not connected to coil 2, by reject filters 28.

Figure 11:
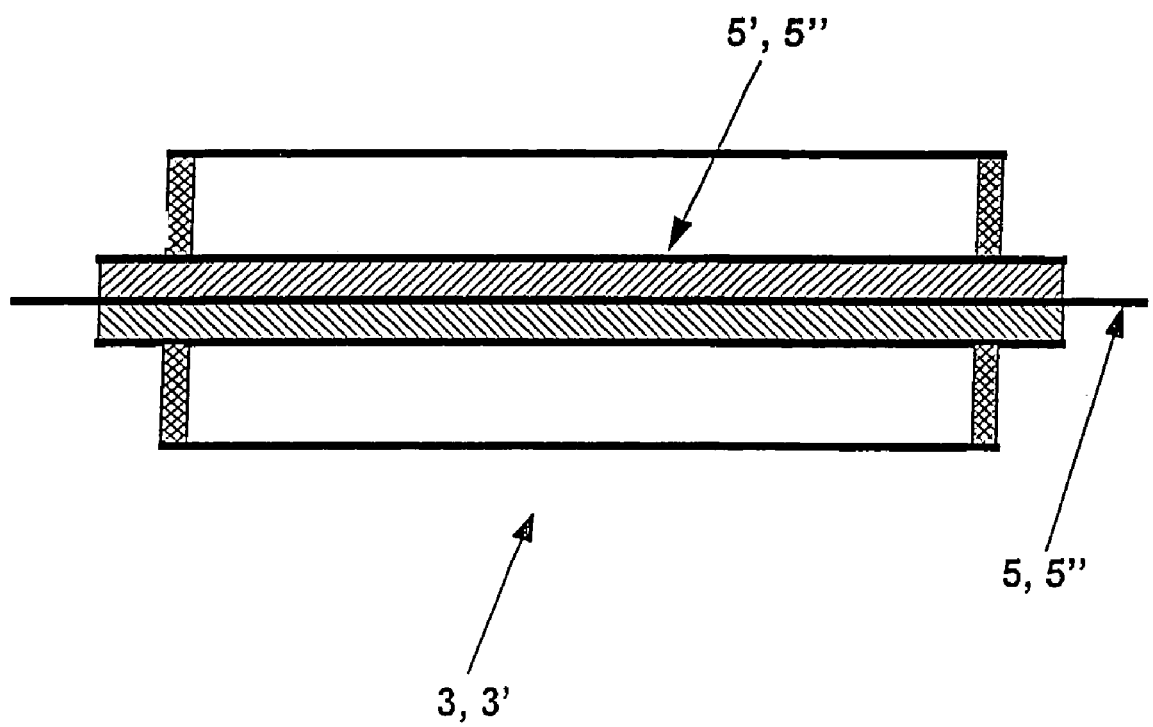
FIG. 11 is a longitudinal cutaway view of an embodiment of a triaxial line segment.

By way of example, as FIG. 11 shows, each triaxial line segment 3, 3' can consist of, for example, a coaxial cable that is mounted either in a metal tube (forming the outside conductor) or in place of the central conductor of a coaxial cable of the largest diameter.

Thanks to the invention, it is therefore possible to provide power with maximum intensity that is always located exactly in the center of coil 2, regardless of the excitation frequency in question.

Also, the addition of an additional oscillating circuit (with symmetrical structure), associated with a corresponding resonance frequency, has essentially no influence on the oscillating circuits that are already part of the power circuit, and in particular does not bring about any dissymmetry in these existing circuits.

Furthermore, transmission line segments 3 and 3' that are used by all oscillating circuits 4, 12, 12' (and at least partly in common with the latter) are not modified and are not the object of any tuning operation, even during the addition of a new oscillating circuit.

The invention also has as its object a multifrequency NMR 33 probe, characterized in that it comprises, at least in part, a power circuit 1 of the sample coil that exhibits at least some of the characteristics indicated above (see FIGS. 8A, 8B, 9, 10A, 10B and 10C).

Finally, the invention also covers an NMR spectrometer, in particular for solid-phase spectrometry, characterized in that it comprises a power circuit 1 of sample coil 2 as described above and a probe of the type mentioned above.

Of course, the invention is not limited to the embodiment described and shown in the attached drawings. Modifications are possible, in particular from the standpoint of the composition of various elements or by substitution of equivalent techniques, without thereby going outside the field of protection of the invention.

The invention claimed is:

1. Power circuit for a coil, in particular an NMR coil or a sample coil, comprising two power or transmission line segments each connected to one of the two ends of this coil, whereby said line segments form with said coil a first oscillating circuit that exhibits a determined resonance frequency, wherein two line segments each comprise at least two conductors of which one is connected to said coil, and between them exhibit identical structures and identical lengths of connected conductors, whereby this common length is essentially a multiple of half of the resonance wavelength of said first oscillating circuit, wherein said conductors that are connected to said coil at one of their ends are connected to one another at their other end by an adjustable symmetrical tuning circuit or a component that completes said first oscillating circuit, and wherein said first oscillating circuit with symmetrical structure is powered by a primary power circuit by means of a transfer of energy by magnetic coupling, capacitive coupling or magneto-capacitive coupling of said primary power circuit with at least one of two conductors that are connected to said coil and to said tuning circuit or said component.

2. Power circuit according to claim 1, wherein primary power circuit is partially merged with first oscillating circuit by integrating a common portion of secondary circuit with this first oscillating circuit, and wherein it comprises, on the one hand, a radio-frequency generator that is tuned to the determined resonance frequency of first oscillating circuit and is connected to said first oscillating circuit at a terminal of adjustable symmetrical tuning circuit or component by means of a coupling capacitor, and, on the other hand, an adaptation circuit or component that is connected to the other terminal of adjustable symmetrical tuning circuit or component, whereby adaptation component and adjustable symmetrical tuning component are part of two circuits, consisting of capacitors and generator that operate continuously, intermittently or in surges.

3. Power circuit according to claim 1, wherein primary power circuit consists of a separate circuit and comprises, in addition to a radio-frequency generator that is tuned to the determined resonance frequency of part or parts that take part in coupling with at least one of two conductors of one or more line segments connected to coil and to tuning circuit or component, also an adaptation circuit or component, intended to optimize the coupling and to limit some of its effects at primary power circuit, whereby generator operates continuously, intermittently or in surges.

4. Power circuit according to claim 3, wherein the coupling is a coupling that is essentially magnetic in nature and wherein adaptation circuit or component is an adjustable capacitor that is intended to cancel the inductive reactance at primary power circuit.

5. Power circuit according to claim 4, wherein the coupling or each of the two couplings carrying out the transfer of energy consists of a primarily magnetic coupling between, on the one hand, a segment of a conductor that is connected to coil of one of line segments of oscillating circuit, and, on the other hand, a segment of the line that connects generator to adaptation component in primary power circuit, whereby these two segments of determined lengths are placed parallel and close to one another and form Lecher lines.

6. Power circuit according to claim 4, wherein the coupling that carries out the transfer of energy consists of a symmetrical or asymmetrical magneto-capacitive coupling between, on the one hand, a solenoid that is mounted in series in primary power circuit, and, on the other hand, a capacitor/inductance unit that is mounted in series in oscillating circuit, whereby said capacitor can correspond to tuning component, and the inductances can comprise two equivalent inductances that are mounted in series on both sides of said capacitor, optionally by each being part of an LC circuit.

7. Power circuit according to claim 1, wherein the transfer of energy by coupling between primary power circuit and oscillating circuit consists of a double coupling and symmetrically and equivalently assigns conductors that are connected to coil of two transmission line segments.

8. Power circuit according to claim 1, wherein it comprises at least one additional oscillating circuit that exhibits a resonance frequency that is different from that of first oscillating circuit and each is formed, if necessary, via coil, by mutually equivalent portions of a conductor of two line segments of first oscillating circuit, and, optionally, two additional transmission line segments that are each connected by one of the ends of at least one of their respective conductors to one of conductors of one of the two above-mentioned line segments and that exhibit between them identical structures and lengths; wherein the sum of the length of each of said two additional transmission line segments and the length of the portion of conductor that is respectively associated with one of two line segments is a multiple of half of the resonance wavelength of additional oscillating circuit that is being considered; wherein additional transmission lines are connected at their other end to a tuning circuit or component; and wherein said at least one or each additional oscillating circuit is powered by its own corresponding primary power circuit by means of a transfer of energy by magnetic coupling, capacitive coupling or magneto-capacitive coupling of this respective corresponding primary power circuit with at least one of conductors that are connected to or are part of line segments of first oscillating circuit, of at least one of two additional transmission line segments.

9. Power circuit according to claim 8, wherein primary power circuit that is unique to each additional oscillating circuit is partially merged with the associated additional oscillating circuit by integrating a part of a common circuit with this additional oscillating circuit and wherein it comprises, on the one hand, a radio-frequency generator that is tuned to the determined resonance frequency of said additional oscillating circuit in question and is connected to the latter at a terminal of the adjustable symmetrical tuning circuit or component of this additional oscillating circuit via a coupling capacitor, and, on the other hand, an adaptation circuit or component connected to the other terminal of the above-mentioned adjustable symmetrical tuning circuit or component, whereby the above-mentioned adaptation component and the adjustable symmetrical tuning component are part of the two circuits, consisting of capacitors.

10. Power circuit according to claim 8, wherein primary power circuit that is unique to each additional oscillating circuit comprises, in addition to a radio-frequency generator that is tuned to the determined resonance frequency and part or parts that take part in coupling with at least one of conductors of additional line segments, an adaptation circuit or component, intended to optimize the coupling and to limit some of its effects at said suitable primary power circuit, whereby generator operates continuously, intermittently or in surges.

11. Power circuit according to claim 10, wherein the coupling with transfer of energy between the oscillating circuit or each additional oscillating circuit and its separate or respectively associated primary power circuit consists of an essentially magnetic coupling, and wherein adaptation circuit or component is an adjustable capacitor that is intended to cancel the inductive reactance at suitable primary power circuit that is being considered.

12. Power circuit according to claim 11, wherein the coupling or each of two couplings that carry out the transfer of energy between a primary power circuit that is unique to an additional oscillating circuit and the latter consists of a magnetic coupling between, one the one hand, a segment of a conductor of an additional line segment, connected to one of line segments of first oscillating circuit, and, on the other hand, a segment, of the line that connects generator to adaptation component in suitable primary power circuit that is associated with additional oscillating circuit that is being considered, whereby these two segments of determined lengths are placed in parallel and close to one another and form Lecher lines.

13. Power circuit according to claim 11, wherein the coupling that produces the transfer of energy between primary power circuit that is unique to an additional oscillating circuit and the latter consists of a symmetrical or asymmetrical magneto-capacitive coupling between, on the one hand, a solenoid, mounted in series in said suitable primary power circuit, and on the other hand, a capacitor/inductance unit that is mounted in series in additional oscillating circuit that is being considered, whereby said capacitor may correspond to tuning component, and the inductances may comprise two inductances that are mounted in series on both sides of said capacitor optionally by each being part of an LC circuit.

14. Power circuit according to claim 8, wherein the transfer of energy by coupling between suitable primary power circuit that is associated with an additional oscillating circuit and the latter consists of a double coupling, optionally with two essentially identical coupling zones and assigning symmetrically and equivalently conductors of additional transmission line segments that are connected to transmission line segments of first oscillating circuit.

15. Power circuit according to claim 8, wherein two additional line segments that are part of said at least one additional oscillating circuit are connected respectively to line segments that are part of first oscillating circuit with regard to the terminals of tuning circuit or component of said first oscillating circuit.

16. Power circuit according to claim 8, wherein first oscillating circuit and/or at least one of additional oscillating circuits integrate(s) one or more band reject insulation filters, if necessary each of them, tuned to the resonance frequency of one or the other oscillating circuit(s).

17. Insulation circuit according to claim 16, wherein insulation filters come in the form of (a) pair(s) of filters, each filter of a given pair of filters being connected in series to or mounted in series with one of conductors connected to coil of first oscillating circuit or to one of conductors of additional line segments of additional oscillating circuit that is being considered, connected to a transmission line of first oscillating circuit.

18. Power circuit according to claim 16, wherein in the presence of a first oscillating circuit and two additional oscillating circuits, at least one of said oscillating circuits integrates two pairs of insulation filters, whereby each pair of filters is tuned to the resonance frequency of one of other two oscillating circuits, whereby at least one of filter pairs can be adjusted in frequency, preferably continuously.

19. Power circuit according to claim 16, wherein insulation filters consist of LC circuit pairs, filter pair(s) that are optionally adjustable in frequency integrating variable capacitors continuously with mutual mechanical control for tuning them.

20. Power circuit according to claim 8, wherein transmission lines that are part of first oscillating circuit consist of coaxial lines, as well as preferably additional transmission lines.

21. Power circuit according to claim 8, wherein transmission line segments that are part of the first oscillating circuit consist of triaxial line segments or three concentric conductors, whereby at least first oscillating circuit integrates conductors that are connected directly to coil of said triaxial lines and at least one other of said oscillating circuits integrates additional concentric conductors of said triaxial lines, and whereby a transfer of energy is carried out between these respectively associated concentric conductors because of the distributed line capacitance of said triaxial lines.

22. Power circuit according to claim 21, wherein conductors that are connected directly to coil of triaxial lines consist of intermediate conductors of the latter and wherein at least one of additional oscillating circuits is connected to and integrates central conductors that are not connected to coil, whereby the line capacitance that is distributed between these central and intermediate conductors provides a connection by transfer of energy that allows said additional oscillating circuit that is being considered to loop to coil via intermediate conductors.

23. Power circuit according to claim 22, wherein intermediate conductors each exhibit a cutoff or physical discontinuity at a respective non-interfering cold point and wherein additional line segments of at least one of additional oscillating circuits are connected to said cold points to portions of intermediate conductors that are connected to coil, whereby the portions of said conductors facing said cutoff or discontinuity are connected to one another frequency-selective energy transfer circuits, for example pass-band filters centered on the resonance frequency of first oscillating circuit and transmitting maximum energy for this frequency.

24. Power circuit according to claim 22, wherein conductors that are directly connected to coil of triaxial lines consist of the central conductors of the latter and wherein at least one of additional oscillating circuits integrates intermediate conductors that are not connected to coil, whereby the line capacitance that is distributed between these central and intermediate conductors provides a connection by transfer of energy that allows said additional oscillating circuit that is being considered to loop to coil via central conductors.

25. Power circuit according to claim 24, wherein conductors of additional line segments of at least one other additional oscillating circuit are connected to central conductors at non-interfering cold points of these conductors, wherein reject filters insulate between them first oscillating circuit and additional oscillating circuit or circuits whose conductors are connected to said central conductors and wherein latter oscillating circuits are also, together, insulated from said at least one additional oscillating circuit that integrates intermediate conductors that are not connected to coil, by reject filters.

26. Power circuit according to claim 8, wherein the coupling with transfer of energy between the oscillating circuit or each additional oscillating circuit and its separate or respectively associated primary power circuit consists of an essentially magnetic coupling, and wherein adaptation circuit or component is an adjustable capacitor that is intended to cancel the inductive reactance at suitable primary power circuit that is being considered.

27. Power circuit according to claim 1, wherein two additional line segments that are part of said at least one or each additional oscillating circuit are connected respectively to line segments that are part of first oscillating circuit at non-interfacing cold points of conductors of these last line segments.

28. Multifrequency NMR probe, wherein it is provided with a power circuit of sample coil according to claim 1.

29. NMR spectrometer, in particular for solid-phase spectrometry, wherein it comprises a power circuit of sample coil according to claim 1.

30. Power circuit according to claim 1, wherein the coupling is a coupling that is essentially magnetic in nature and wherein adaptation circuit or component is an adjustable capacitor that is intended to cancel the inductive reactance at primary power circuit.

* * * * *